US008102349B2

(12) United States Patent
Ashizawa et al.

(10) Patent No.: US 8,102,349 B2
(45) Date of Patent: Jan. 24, 2012

(54) DISPLAY DEVICE

(75) Inventors: Keiichirou Ashizawa, Mobara (JP);
Katsumi Ichihara, Mutsuzawa (JP);
Masafumi Hirata, Ooamishirasato (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 807 days.

(21) Appl. No.: 12/176,598

(22) Filed: Jul. 21, 2008

(65) Prior Publication Data

US 2009/0033609 A1 Feb. 5, 2009

(30) Foreign Application Priority Data

Jul. 31, 2007 (JP) ................................ 2007-199406

(51) Int. Cl.
*G09G 3/36* (2006.01)

(52) U.S. Cl. ........... 345/92; 349/139; 349/149; 349/152

(58) Field of Classification Search ............... 345/33, 345/36–39, 41–51, 55, 84–88, 90–93, 98–108, 345/204–214, 690, 694–696, 698; 315/169.1–169.4; 349/139, 149, 152
See application file for complete search history.

(56) References Cited

U.S. PATENT DOCUMENTS

| | | | | |
|---|---|---|---|---|
| 6,104,465 A * | 8/2000 | Na et al. | ......................... | 349/152 |
| 6,683,669 B1 * | 1/2004 | Fujikawa | ...................... | 349/149 |
| 7,433,008 B2 * | 10/2008 | Kim | ............................... | 349/152 |
| 7,612,853 B2 * | 11/2009 | Ohta et al. | ..................... | 349/139 |
| 7,808,176 B2 * | 10/2010 | Sakaguchi et al. | ............ | 313/506 |
| 2005/0270009 A1 * | 12/2005 | Ohki et al. | .................... | 323/298 |
| 2007/0153208 A1 * | 7/2007 | Sakaguchi et al. | ............ | 349/149 |

FOREIGN PATENT DOCUMENTS

| | | | |
|---|---|---|---|
| JP | 06-011721 | | 1/1994 |
| JP | 1994-011721 A | * | 1/1994 |
| JP | 09-090399 | | 4/1997 |
| JP | 1997-090399 A | * | 4/1997 |
| JP | 11-327464 | | 11/1999 |
| JP | 1999-327464 A | * | 11/1999 |

* cited by examiner

*Primary Examiner* — Quan-Zhen Wang
*Assistant Examiner* — Michael J Eurice
(74) *Attorney, Agent, or Firm* — Antonelli, Terry, Stout & Kraus, LLP.

(57) ABSTRACT

A liquid crystal display device includes a liquid crystal display panel which sandwiches liquid crystal in the inside thereof sealed by a TFT substrate, a color filter substrate and a sealing portion, and a flexible printed circuit board which is mounted on the TFT substrate, wherein the TFT substrate has an area larger than the color filter substrate. A plurality of scanning lines extend in a lateral direction and are arranged parallel to each other in a longitudinal direction, a plurality data signal lines extend in the longitudinal direction and are arranged parallel to each other in the lateral direction, and terminal portions corresponding to the scanning lines are formed on the TFT substrate, the terminal portion is arranged at a region that is not covered by the color filter substrate. The terminal portions and the scanning lines are connected by auxiliary lines and connection lines in order from the terminal portions. The connection lines are arranged in a region covered with the color filter substrate, and the auxiliary lines extend to both the region that is covered by the color filter substrate and the region that is not covered by the color filter substrate.

12 Claims, 7 Drawing Sheets

DISPLAY DEVICE

The present application claims priority from Japanese application JP2007-199406 filed on Jul. 31, 2007, the content of which is hereby incorporated by reference into this application.

BACKGROUND OF THE INVENTION

1. Field of the Invention

The present invention relates to a liquid crystal display device, and more particularly to a technique which can enhance the reliability of terminal portions of signal lines formed on a substrate.

2. Description of the Related Art

A liquid crystal display device sandwiches liquid crystal between two glass substrates consisting of a TFT substrate and a color filter substrate, and forms an image by controlling a quantity of light which passes through pixels in response to electric signals. With respect to the signals for forming the image, through terminal portions formed on the TFT substrate, scanning signals are supplied to scanning lines and image data signals are supplied to data signal lines. In response to the scanning signals, TFTs are selected and the TFT fetches the data signals thus controlling voltages of the respective pixels.

Generally, signals are supplied to the terminal portions from the outside via a flexible printed circuit board or the like. The scanning lines, data signal lines and the like are determined based on the resolution of a screen or intervals between pixels. On the other hand, the flexible printed circuit board is standardized, and intervals between terminals of the flexible printed circuit board are also standardized. Further, the intervals between terminals are standardized by also taking a condition on connection of the flexible printed circuit board with the glass substrate into consideration.

Accordingly, the intervals between terminals differ from intervals between scanning lines and intervals between data signal line and, in general, the intervals between terminals are set smaller than the intervals between scanning lines and the intervals between data signal lines. Due to such a constitution, a length of a connection portion which connects a terminal corresponding to a center portion of the flexible printed circuit board with the scanning line or the data signal line differs from a length of a connection portion which connects a terminal corresponding to a peripheral portion of the flexible printed circuit board with the scanning line or the data signal line. In this case, the resistance of the scanning line or the data signal line differs depending on a position of the scanning line, the data signal line or the like thus giving rise to a drawback that delay of a scanning signal or distortion of a data signal or the like differs depending on the position of the line.

JP-A-6-11721 (patent document 1) discloses a technique which makes the resistances of lines connecting the scanning lines or the like with the terminal portions equal to each other for eliminating the difference in resistance value depending on the position of the scanning line or the data signal line. That is, in the technique disclosed in patent document 1, for example, a width of a connection portion which connects a terminal portion corresponding to a center portion of a flexible printed circuit board and the scanning line or the like with each other is set smaller than a width of a connection portion which connects a terminal portion corresponding to a peripheral portion of the flexible printed circuit board and the scanning line or the like with each other.

On the other hand, to explain a liquid crystal display panel, a plurality of liquid crystal display panels is formed on a large-sized mother glass and, thereafter, by cutting the mother glass, individual liquid crystal display panels are formed. The cutting is performed by scribing or the like. When the glass is cut by scribing, glass debris is generated. When the glass debris adheres to the vicinity of the terminal and pressure is applied to the terminal from the outside, there exists a possibility that disconnection of a line occurs in the vicinity of the terminal. JP-A-9-90399 (patent document 2) discloses a technique which can prevent such disconnection of the line in the vicinity of the terminal due to a foreign material from the outside.

Figure 7A:
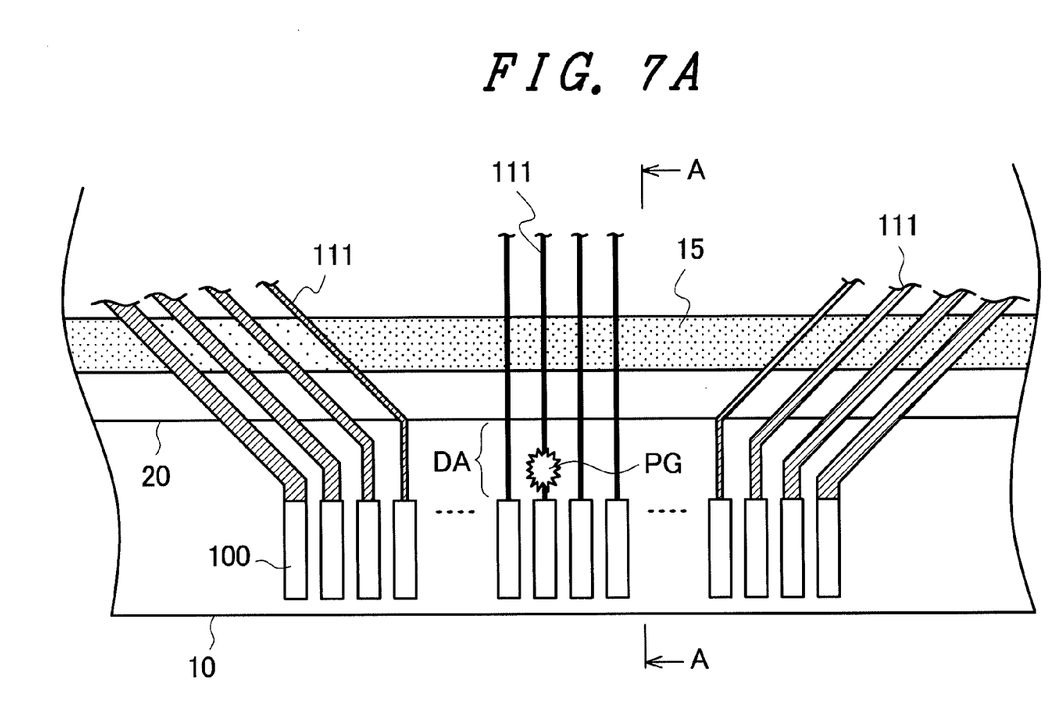
FIG. 7A is a view showing the wiring structure in the vicinity of terminal portions of a conventional example.
Figure 7B:
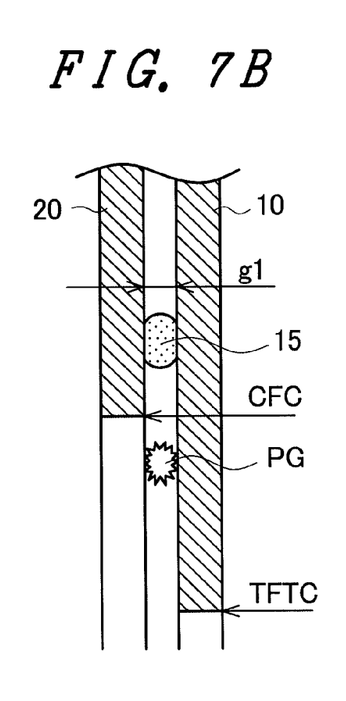
FIG. 7B is a cross-sectional view taken along a line A-A in FIG. 7A.

FIG. 7A and FIG. 7B are enlarged schematic views showing a portion in the vicinity of a terminal of a liquid crystal display panel. FIG. 7A is an enlarged plan view showing the vicinity of terminal portions 100, and FIG. 7B is a cross-sectional view taken along a line A-A in FIG. 7A. In FIG. 7A, a TFT substrate 10 and a color filter substrate 20 face each other in an opposed manner with a predetermined gap therebetween, and liquid crystal is sandwiched between the TFT substrate 10 and the color filter substrate 20. The liquid crystal is sealed by the TFT substrate 10, the color filter substrate 20 and a sealing portion 15.

Figure 2A:
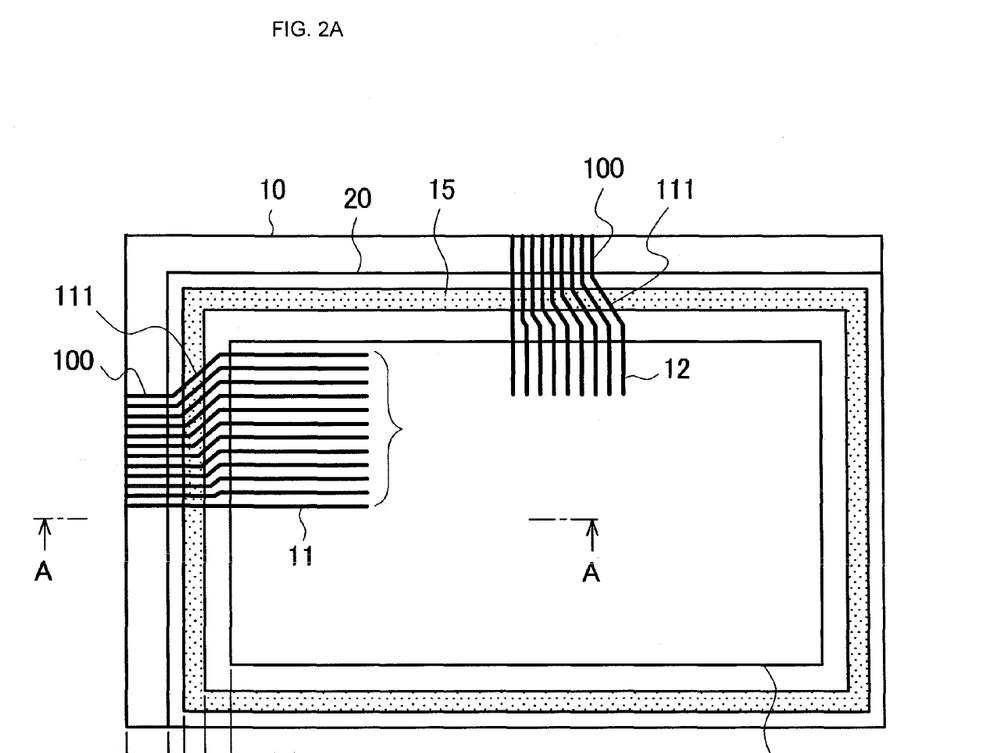
FIG. 2A is a view showing a wiring state of terminal portions for explaining the present invention.

In FIG. 7A, the terminal portions 100 which are connected with the flexible printed circuit board 30 are formed on an end portion of the TFT substrate 10 at fixed intervals. Assume that the terminal portions 100 shown in FIG. 7A are connected with scanning lines 11, as shown in FIG. 2A. Intervals between the scanning lines 11 formed in a display region of the liquid crystal display panel are set larger than intervals between the terminal portions 100 and hence, lines which extend from the periphery of the flexible printed circuit board 30 and are connected with the scanning lines 11 are spread outwardly, and lines which extend from a center portion of the flexible printed circuit board 30 and are connected with the scanning lines 11 extend in a straight manner. To set resistance values of the scanning lines 11 to a fixed value, the lines which are connected with the terminals arranged at the center portion of the flexible printed circuit board 30 are formed of a fine line, while the lines which are connected with the terminals arranged at the periphery of the flexible printed circuit board 30 are formed of a bold line.

Respective individual liquid crystal display panels are formed by cutting a large-sized mother glass. FIG. 7B is a cross-sectional view of the liquid crystal display panel showing such a situation. In FIG. 7B, the color filter substrate 20 is cut along a cutting line CFC, and the TFT substrate 10 is cut along a cutting line TFTC. Since the terminal portions 100 are formed on the TFT substrate 10, the TFT substrate 10 has an area larger than an area of the color filter substrate 20. Here, the cutting is performed by scribing or the like and hence, glass debris PG is generated.

When the glass debris PG is brought into contact with a specifically fine portion of the connection line 111 of the scanning line 11 and pressure is applied to such a portion from the outside, the connection line 111 is disconnected at such a portion. Due to such disconnection, one line in a display region becomes defective and hence, the whole liquid crystal display panel becomes defective. When such disconnection is generated before shipping a product from a factory, it is possible to prevent the defective product from being shipped to a market by the examination. However, there may be a case that the fine connection line 111 is half-disconnected, and when a half-disconnected portion is completely disconnected during the operation of the product in the market after shipping, the product becomes defective in use.

To prevent the occurrence of the disconnection of the connection line 111, patent document 2 discloses a technique which can reduce probability that the glass debris or the like is brought into contact with the terminal by forming a layer having the substantially same constitution as a color filter between the terminals and by forming a projecting portion on both sides of the terminal. However, the above-mentioned technique requires processing for forming the projecting portion between the terminals thus pushing up a manufacturing cost.

Further, the patent document 2 also discloses a technique which can increase a width of a line between the terminal portion 100 and the scanning line 11 in addition to the technique for forming the projecting portion between the terminal potion 100 and the scanning line 11. However, patent document 2 fails to disclose a technique which changes a line width of the connection line 111 between the terminal portion 100 and the scanning line 11 or the data signal line 12 for setting the resistances of the scanning lines 11 or the data signal lines 12 to a fixed value.

Figure 8:
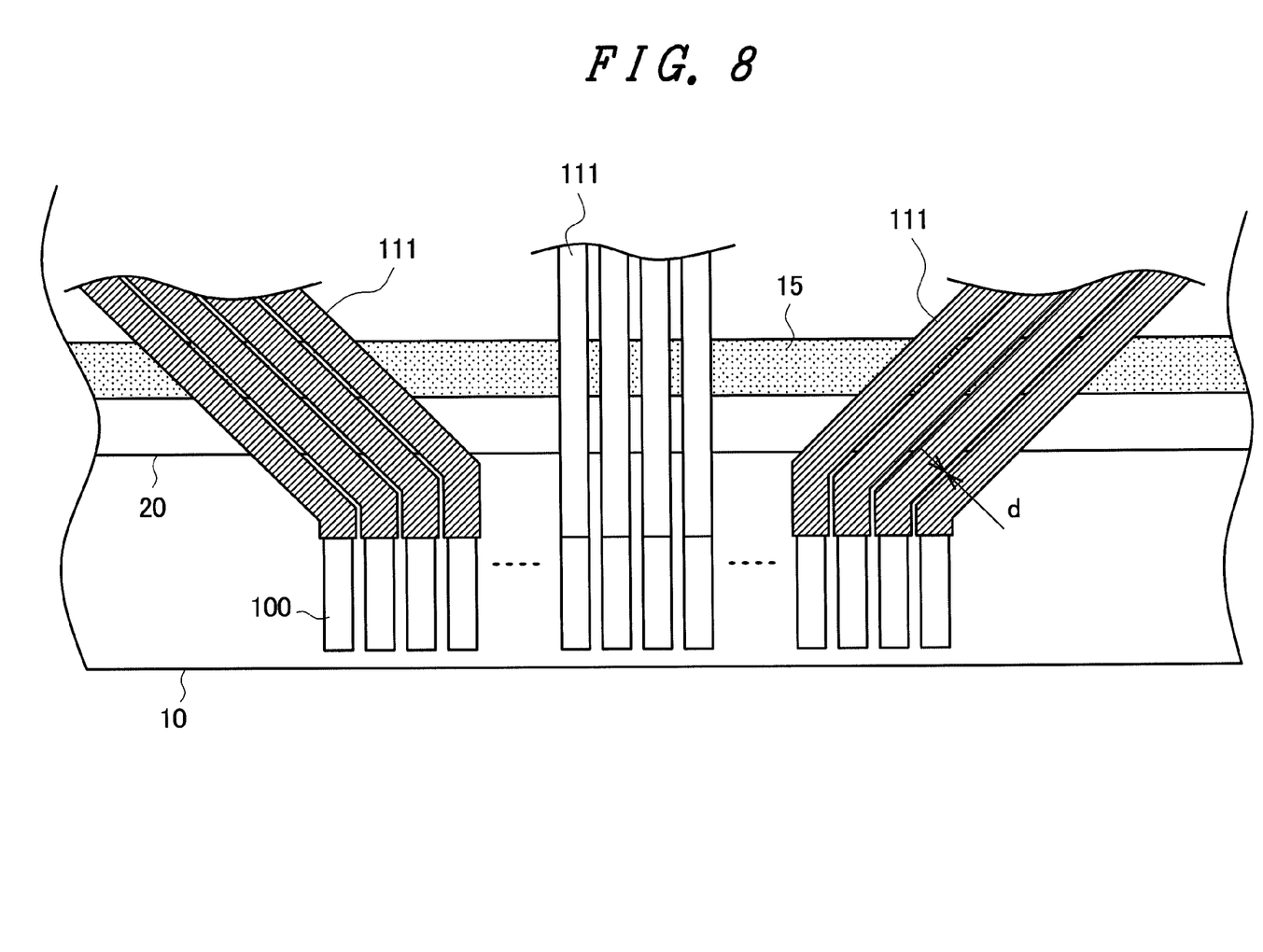
FIG. 8 is a view showing an example when line intervals are decreased in a peripheral portion of the terminal portions.

Here, in an attempt to apply the technique disclosed in the patent document 2 to a technique which changes the width of the connection line 111 for setting the resistances of the scanning lines 11 or the resistances of the data signal lines 12 to a fixed value, a drawback shown in FIG. 8 arises. FIG. 8 is a plan view substantially equal to FIG. 7A. In FIG. 8, at the center portion of the flexible printed circuit board 30, the scanning lines 11 which are shown in FIG. 2A, the connection lines 111 and the terminal portions 100 have the substantially same width. When the width of the connection line 111 corresponding to the periphery of the flexible printed circuit board 30 is increased for setting the resistances of the scanning lines 11 to a fixed value, as shown in FIG. 8, a distance d between the connection lines 111 is decreased thus giving rise to a possibility of a drawback that short-circuiting occurs between the connection lines 111.

To prevent such short-circuiting between the connection lines, as described in patent document 2, the projecting portion formed of the color filter or the like may be formed between the connection lines 111. However, such a technique pushes up a manufacturing cost. Further, the intervals between the terminals are fixed and hence, the width of the connection line 111 which corresponds to the periphery of the flexible printed circuit board 30 cannot be set to a fixed value or more and hence, it becomes practically impossible to set the resistances of the scanning lines 11 to a fixed value.

SUMMARY OF THE INVENTION

The present invention has been made to overcome the above-mentioned drawbacks. According to the present invention, a width of the connection line which connects a terminal portion in a portion of a TFT substrate which is not covered with a color filter substrate and a scanning line or the like is set to a predetermined value or more. Further, in a portion of the TFT substrate which is covered with the color filter substrate, the width of the connection line is freely changed within a range from a value smaller than the width of the terminal portion to a value larger than the width of the terminal portion for setting the resistances of the scanning lines or the like to a fixed value. To explain the present invention more specifically, they are as follows.

(1) The present invention is directed to a liquid crystal display device including a liquid crystal display panel which sandwiches liquid crystal in the inside thereof sealed by a TFT substrate, a color filter substrate and a sealing portion, and a flexible printed circuit board which is mounted on the TFT substrate, wherein scanning lines which extend in the lateral direction and are arranged parallel to each other in the longitudinal direction, data signal lines which extend in the longitudinal direction and are arranged parallel to each other in the lateral direction, and terminal portions corresponding to the scanning lines are formed on the TFT substrate, the terminal portions are formed as a unit for every flexible printed circuit board, and the terminal portions and the scanning lines are connected by auxiliary lines and connection lines in order from the terminal portions, and the connection lines are arranged in a region covered with the color filter substrate, a width of the connection line at a peripheral portion of the unit is set larger than the width of the connection line at a center portion of the unit, the auxiliary line between the terminal portion and the connection line is formed of a straight line, and a width of the auxiliary line is 20 µm or more and is set larger than the width of the connection line at the center portion of the unit.

(2) In the display device having the constitution (1), the width of the auxiliary line may be 23 µm or more.

(3) In the display device having the constitution (1), the width of the auxiliary line may be equal to a width of the terminal portion.

(4) The present invention is directed to a liquid crystal display device including a liquid crystal display panel which sandwiches liquid crystal in the inside thereof sealed by a TFT substrate, a color filter substrate and a sealing portion, and a flexible printed circuit board which is mounted on the TFT substrate, wherein scanning lines which extend in the lateral direction and are arranged parallel to each other in the longitudinal direction, data signal lines which extend in the longitudinal direction and are arranged parallel to each other in the lateral direction, and terminal portions corresponding to the data signal lines are formed on the TFT substrate, the terminal portions are formed as a unit for every flexible printed circuit board, and the terminal portions and the data signal lines are connected by auxiliary lines and connection lines in order from the terminal portions, and the connection lines are arranged in a region covered with the color filter substrate, a width of the connection line at a peripheral portion of the unit is set larger than the width of the connection line at a center portion of the unit, the auxiliary line between the terminal portion and the connection line is formed of a straight line, and a width of the auxiliary line is 20 µm or more and is set larger than the width of the connection line at the center portion of the unit.

(5) In the display device having the constitution (4), the width of the auxiliary line may be 23 µm or more.

(6) In the display device having the constitution (4), the width of the auxiliary line may be equal to a width of the terminal portion.

(7) The present invention is directed to a liquid crystal display device including a liquid crystal display panel which sandwiches liquid crystal in the inside thereof sealed by a TFT substrate, a color filter substrate and a sealing portion, and a flexible printed circuit board which is mounted on the TFT substrate, wherein scanning lines which extend in the lateral direction and are arranged parallel to each other in the longitudinal direction, data signal lines which extend in the longitudinal direction and are arranged parallel to each other in the lateral direction, and terminal portions corresponding to the scanning lines are formed on the TFT substrate, the terminal portions are formed as a unit for every flexible printed circuit board, and the terminal portions and the scanning lines are connected by auxiliary lines and connection lines in order from the terminal portions, the connection line is configured such that the connection line is formed of a straight line at a center portion of the unit and is arranged outside at a peripheral portion of the unit, and the connection lines are arranged in a region covered with the color filter substrate, a width of the connection line at a peripheral portion of the unit is set larger than the width of the connection line at a center portion of the unit, the auxiliary line is configured such that the auxiliary line is formed of a straight line at the center portion of the unit and is arranged outside in the peripheral portion of the unit, and a width of the auxiliary line is 20 μm or more.

(8) In the display device having the constitution (7), the width of the auxiliary line may be 23 μm or more.

(9) In the display device having the constitution (7), the width of the auxiliary line may be equal to a width of the terminal portion.

(10) The present invention is directed to a liquid crystal display device including a liquid crystal display panel which sandwiches liquid crystal in the inside thereof sealed by a TFT substrate, a color filter substrate and a sealing portion, and a flexible printed circuit board which is mounted on the TFT substrate, wherein scanning lines which extend in the lateral direction and are arranged parallel to each other in the longitudinal direction, data signal lines which extend in the longitudinal direction and are arranged parallel to each other in the lateral direction, and terminal portions corresponding to the data signal lines are formed on the TFT substrate, the terminal portions are formed as a unit for every flexible printed circuit board, and the terminal portions and the data signal lines are connected by auxiliary lines and connection lines in order from the terminal portions, the connection line is configured such that the connection line is formed of a straight line at a center portion of the unit and is arranged outside at a peripheral portion of the unit, and the connection lines are arranged in a region covered with the color filter substrate, a width of the connection line at a peripheral portion of the unit is set larger than the width of the connection line at a center portion of the unit, the auxiliary line is configured such that the auxiliary line is formed of a straight line at the center portion of the unit and is arranged outside in the peripheral portion of the unit, and a width of the auxiliary line is 20 μm or more.

(11) In the display device having the constitution (10), the width of the auxiliary line may be 23 μm or more.

(12) In the display device having the constitution (10), the width of the auxiliary line may be equal to a width of the terminal portion.

According to the present invention, the terminal portions are collectively formed as a unit for every flexible printed circuit board, and the auxiliary lines and the connection lines are formed on a portion where the terminal portions and the scanning lines are connected with each other in order from the terminal portions and hence, it is possible to make the line resistances of the scanning lines uniform and, at the same time, it is possible to prevent the disconnection between the terminal portion and the scanning line. That is, by setting the width of the auxiliary line to 20 μm or more in a range other than a range where the TFT substrate and the color filter substrate overlap with each other, even when the line is damaged with a flaw due to glass debris or the like, it is possible to prevent the disconnection of the line attributed to such a flaw.

Further, to make the resistances of the scanning lines uniform, the connection lines are formed such that the connection line is formed of a straight line at the center portion of the unit and is spread to the outside in the peripheral portion of the unit, and the line width of the connection line at the peripheral portion of the unit can be set larger than the line width of the connection line at the center portion of the unit. This arrangement can be realized by setting the width of the auxiliary line smaller than the width of the connection line at the center portion of the unit.

Further, by forming the auxiliary line such that the auxiliary line at the center portion of the unit is formed of a straight line and the auxiliary line at the peripheral portion of the unit is formed of a line which expands outwardly, it is possible to make the resistances of the scanning lines uniform more easily. Also in this case, by setting the width of the auxiliary line to 20 μm or more, it is possible to prevent disconnection attributed to the glass debris or the like.

The above-mentioned advantageous effects can be obtained not only at the terminal portions of the scanning lines but also at terminal portions of the data signal lines in a substantially same manner.

DESCRIPTION OF THE PREFERRED EMBODIMENT

Hereinafter, the present invention is explained in detail in conjunction with embodiments.

Embodiment 1

Figure 1:
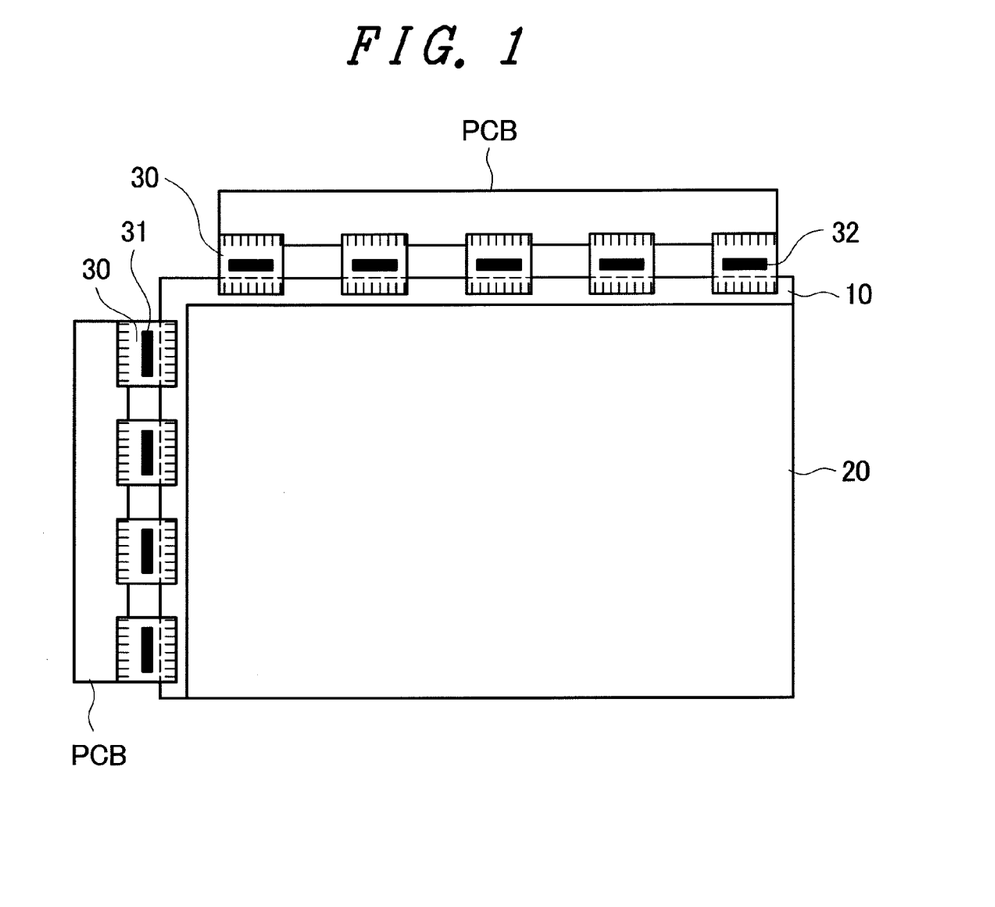
FIG. 1 is a schematic appearance view of a liquid crystal display device.

FIG. 1 is a schematic appearance view of a module of a liquid crystal display device. In FIG. 1, a liquid crystal display panel is constituted of a TFT substrate 10 and a color filter substrate 20.

As shown in FIG. 2A described later, on the TFT substrate 10, a large number of scanning lines 11 which extend in the lateral direction and are arranged parallel to each other in the longitudinal direction are formed. Further, a large number of data signal lines 12 which extend in the longitudinal direction and are arranged parallel to each other in the lateral direction are formed on the TFT substrate 10. In each region (pixel region) surrounded by the scanning lines 11 and the data signal lines 12, a thin film transistor (TFT) and a pixel electrode are formed. On the color filter substrate 20, color filters for forming color images are formed respectively corresponding to the pixel electrodes. For forming terminal portions 100 on the TFT substrate 10, the TFT substrate 10 is formed larger than the color filter substrate 20.

In FIG. 1, scanning signals are supplied from a left short side, and data signals are supplied from an upper long side. Terminals connected with the scanning lines 11 or the data signal lines 12 are collectively formed as a unit for every flexible printed circuit board 30.

The flexible printed circuit boards 30 are mounted on the left short side portion of the TFT substrate 10 by heat sealing or the like. Terminals are formed on the flexible printed circuit board 30 at fixed intervals. The intervals between the terminal portions 100 formed on the flexible printed circuit board 30 are set smaller than intervals between the scanning lines 11 formed in a display region 50 of the liquid crystal display panel. On each flexible printed circuit board 30 mounted on the short side portion of the TFT substrate 10, a scanning line driver 31 is mounted. Further, the flexible printed circuit boards 30 are respectively connected to printed circuit boards (PCB) on each of which a power source circuit and the like are formed. The flexible printed circuit boards 30 are folded back along a dotted line in FIG. 1, and the printed circuit boards PCB are arranged on a back side of the liquid crystal display panel. Here, there may be a case that the scanning-line-side printed circuit boards PCB are not connected to the flexible printed circuit board 30. In this case, the supply of signals and power to the scanning line driver 31 is performed via a data-signal-line-side printed circuit board PCB.

On the upper long side portion of the TFT substrate 10, the terminal portions 100 for supplying electric signals to the data signal lines 12 are formed. The flexible printed circuit boards 30 are mounted on the terminal portions 100 by heat sealing or the like. The terminals which are connected with the data signal lines 12 are collectively formed as a unit for every flexible printed circuit board 30. A data signal line driver 32 is mounted on each flexible printed circuit board 30. These flexible printed circuit boards 30 are connected with a printed circuit boards PCB on each of which a timing controller, a ladder resistance and the like are mounted or printed circuit boards PCB on each of which connection lines to a timing controller formed on another printed circuit board are mounted. The printed circuit board PCB is folded back and arranged on a back side of the liquid crystal display panel in the same manner as the short-side printed circuit board PCB.

Figure 2B:
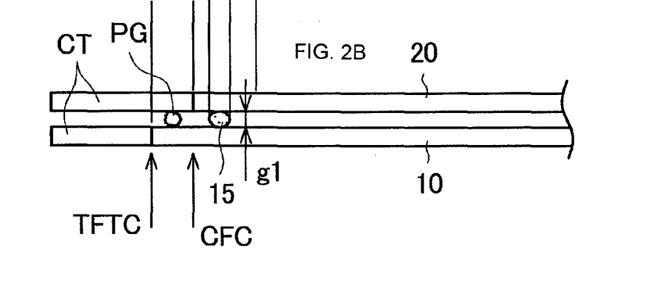
FIG. 2B is a cross-sectional view taken along a line A-A in FIG. 2A.

FIG. 2A and FIG. 2B are schematic views showing shapes of the scanning lines 11, the data signal lines 12 and the terminal portions 100 while omitting the flexible printed circuit boards 30 and the like from FIG. 1. In FIG. 2A and FIG. 2B, one half of the terminal portions 100 which are collectively formed for every flexible printed circuit board 30 is shown. FIG. 2A is a plan view and FIG. 2B is a cross-sectional view taken along a line A-A in FIG. 2A. In FIG. 2A, a space defined between the TFT substrate 10 and the color filter substrate 20 is sealed by a sealing portion 15, and the space inside the sealing portion 15 is filled with liquid crystal.

The lines shown in FIG. 2A indicate one half of lines of the flexible printed circuit board 30 in an enlarged manner. In FIG. 2A, terminals which are connected with the flexible printed circuit boards 30 are formed on an end portion of the TFT substrate 10. Further, numeral 50 in FIG. 2A indicates a display region.

On a short side portion of the TFT substrate 10, the terminal portions 100 for supplying scanning signals are formed. Intervals between the terminal portions 100 are set smaller than intervals between the scanning lines 11 formed in the display region 50. Accordingly, connection lines 111 which connect the terminal portions 100 and the scanning lines 11 are partially arranged obliquely. Further, on a long side portion of the TFT substrate 10, the terminal portions 100 for supplying the data signals are formed. Intervals between the terminal portions 100 are set smaller than intervals between the data signal lines 12 formed in the display region 50. Accordingly, connection lines 111 which connect the terminal portions 100 and the data signal lines 12 are partially arranged obliquely in the same manner as the connection lines 111 on the side of the scanning lines 11.

As shown in FIG. 2B, the TFT substrate 10 and the color filter substrate 20 are obtained by cutting a large-sized board. A cutting line for the TFT substrate 10 is indicated by symbol TFTC, and a cutting line for the color filter substrate 20 is indicated by symbol CFC. Although edge materials CT which are produced when the color filter substrate 20 and the TFT substrate 10 are cut are discarded, glass debris PG is generated during cutting. When the glass debris PG adheres to the connection line 111 which connects the terminal portion 100 and the scanning line 11 or connects the terminal portion 100 and the data signal line 12, there exists a possibility that the glass debris PG causes disconnection of the connection line 111.

As shown in FIG. 2B, a gap g1 between the TFT substrate 10 and the color filter substrate 20 is approximately 6 μm. Since the glass debris which enters the gap g1 is small, a serious problem on disconnection does not arise. On the other hand, as shown in FIG. 2B, there exists a possibility that large glass debris adheres to a portion of the TFT substrate 10 which is not covered with the color filter substrate 20 and hence, flaws on lines caused by such large glass debris PG may cause a disconnection defect.

Figure 3A:
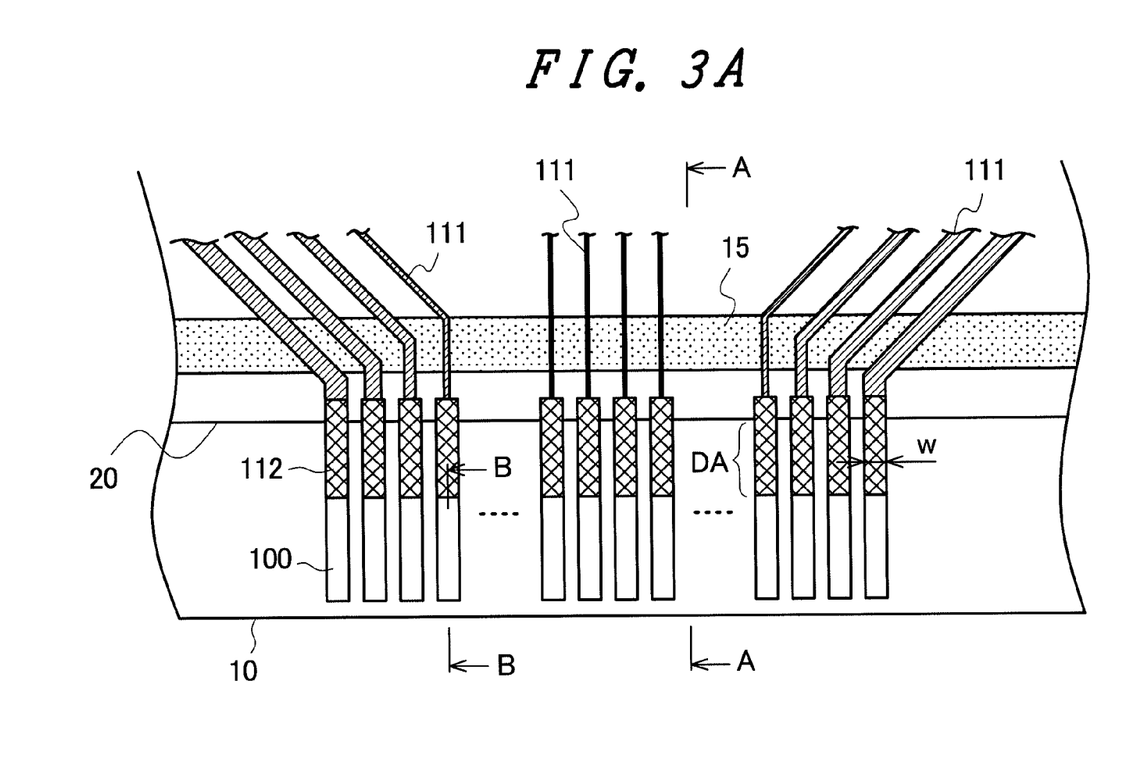
FIG. 3A is a view showing the wiring structure in the vicinity of terminal portions of an embodiment 1.
Figure 3B:
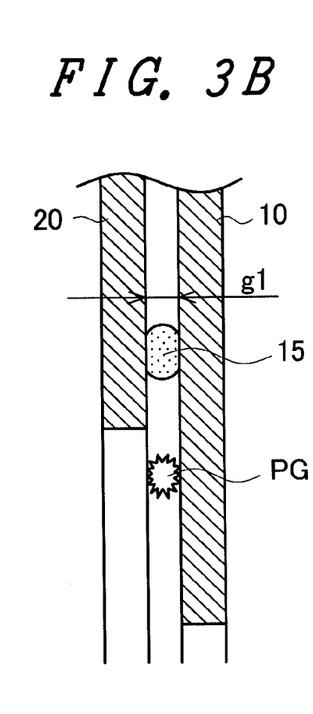
FIG. 3B is a cross-sectional view taken along a line A-A in FIG. 3A

FIG. 3A and FIG. 3B are views showing the detail of the vicinity of the terminal portions 100 formed on the short side of the TFT substrate 10. FIG. 3A and FIG. 3B show a unit of terminal portions 100 corresponding to one sheet of the flexible printed circuit board 30. FIG. 3A is a plan view, and FIG. 3B is a cross-sectional view taken along a line A-A in FIG. 3A. In FIG. 3A, terminals are arranged at specific intervals. Since the interval between the scanning lines is larger than the interval between the terminals, the connection lines 111 which connect the scanning lines 11 with the terminal portions 100 are arranged obliquely on a periphery of the terminal portions 100. Further, to set resistances of the scanning lines 11 from the terminal portions 100 to a fixed value, line widths of the oblique line portions are made different from each other. That is, a line width of the connection line 111 at the center portion of the TFT substrate 10 is set small because a length of the connection line 111 at the center portion is short, and the line width of the connection line 111 is gradually increased toward a periphery of the TFT substrate 10.

Figure 4:
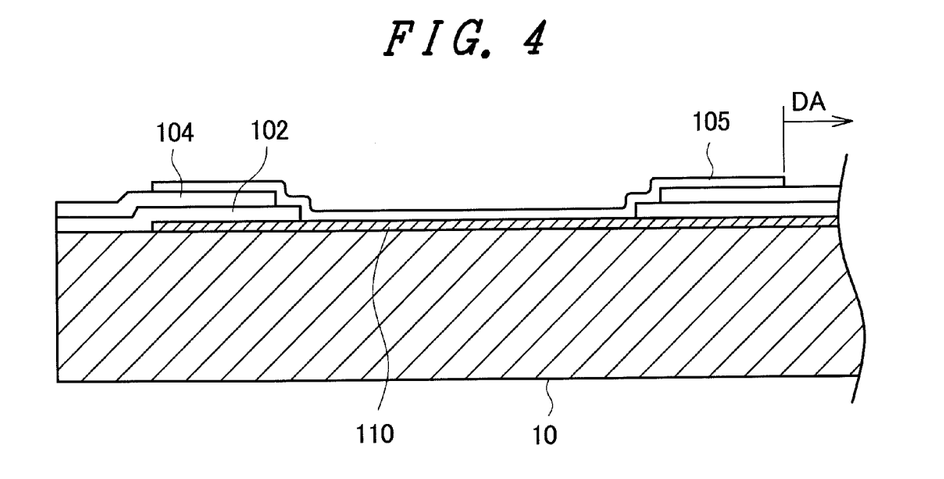
FIG. 4 is a view showing the cross-sectional structure of the terminal portion.

FIG. 4 is a cross-sectional view taken along a line B-B in FIG. 3, and shows the structure of the terminal portion 100. The structure of the terminal portion 100 is the cross-sectional structure of a corresponding terminal portion 100 when a bottom-gate-type TFT is formed. In FIG. 4, a background metal film 110 made of the same material as the gate lines (scanning lines 11) are formed on the glass substrate. In general, this layer adopts the three-layered structure consisting of Mo—Al—Mo layers. Although the Al layer mainly conducts electricity, to prevent hillock of Al or to prevent oxidation of Al due to the contact of Al layer with the ITO layer 105 or the like, the Al layer is covered with Mo.

In FIG. 4, the background metal film 110 is protected by the gate insulation film 102 and the passivation film 104. To connect the background metal film 110 with the flexible printed circuit board 30, through holes are formed in the gate insulation film 102 and the passivation film 104, and the through hole portions are covered with an ITO film 105 which is a chemically stable transparent conductive film. The ITO film 105 on the terminal portions 100 are formed simultaneously with the formation of the pixel electrodes within the display region 50. Since a portion of the ITO film 105 is covered with the flexible printed circuit board 30 and hence, within a region DA which is on a side closer to the display region 50 than the portion of the ITO film 105, there arises a zone where the disconnection occurs due to glass debris or the like. Although the background metal film 110 is protected by the gate insulation film 102, the passivation film 104 and the like, thicknesses of these films are approximately 200 nm to 300 nm and hence, when the glass debris is adhered to the gate insulation film 102, the passivation film 104 or the like and pressure is applied to the background metal film 110 from the outside, these films are broken whereby it is not possible to protect the background metal film 110.

Returning to FIG. 3, the technical features of the present invention are explained. The main technical feature of the present invention is about widths of the connection lines 111. Specifically, in the region DA from the end of the terminal portions 100 to a portion where is covered with the color filter substrate 20, the auxiliary lines 112 which are formed by extending widths of the connection lines 111 are formed. In FIG. 3A, a line width of the auxiliary line 112 in the region DA is set equal to the width of the terminal portion 100.

Inventors of the present invention have carried out various experiments on the line width of the auxiliary line 112. According to the experiments, it is found that when the line width w in the region DA is set to 20 μm or more, a defect caused by disconnection can be completely eliminated. A half disconnected line caused by glass debris PG may cause a connection defect in a market and hence, the half disconnected line is serious. Although flaws on a line caused by glass debris or the like is unavoidable, provided that the line can ensure a certain amount of line width, it is possible to allow a required electric current to flow in a remaining portion of the line even when the flaws occur on the line whereby the disconnection of the line in the market can be prevented. According to the experiments carried out by the inventors of the present invention, it is confirmed that when the line width w of the auxiliary line 112 exceeds 20 μm, even in a state that glass debris PG is generated, it is possible to almost completely eliminate the possibility that the connection defect occurs in the market. Further, it is also confirmed that when the line width w of the auxiliary 112 exceeds 23 μm, a defect occurrence ratio can be surely set to zero.

In FIG. 3, the line width w of the auxiliary line 112 is set to the same value at the center portion as well as at peripheries of the flexible printed circuit board 30. However, in this embodiment, it is not necessary to set the width w of the auxiliary line 112 in such a manner. The width of the auxiliary line 112 can be increased provided that the generation of short-circuiting between the auxiliary lines 112 can be prevented.

The technical feature of this embodiment lies in that the auxiliary line 112 in the region DA from the terminal portion 100 on the TFT substrate 10 to the portion where the TFT substrate 10 is covered with the color filter substrate 20 is extended linearly from the terminal portion 100 and, thereafter, the line width of the connection line 111 is changed to set the resistance of the scanning line 11 is set to a fixed value. Due to such constitution, in a region which passes the region DA where the line width w is set to a fixed value, the line width of the connection line 111 connected to the scanning line 11 can be set smaller than the width of the auxiliary line 112 or the width of the terminal.

In this manner, according to the constitution of this embodiment, even when a possibility of the occurrence of disconnection is prevented by setting the line width w of the auxiliary line 112 in the region DA in FIG. 3A to a fixed value or more, for example, 20 μm or more, the width of the connection line 111 which follows the auxiliary line 112 can be decreased and hence, in the same manner as the related art, the resistance of scanning line 11 can be made uniform by changing the line width of the oblique line.

Here, the length of the region DA in FIG. 3A is approximately 1 mm and hence, the resistance of the whole scanning line 11 is hardly influenced. On the other hand, in the region DA, the formation of the region where the auxiliary line 112 has the fixed line width w may influence the display region 50, that is, may influence a size of a picture frame. However, the resistance can be adjusted by changing a ratio of line widths of the connection lines 111 between the center portion and the peripheral portion of the flexible printed circuit board 30. That is, with respect to the connection lines 111 of the scanning lines 11, the resistances are adjusted based on the line widths of only portions of the connection lines 111 which are covered with the color filter substrate 20 thus being set free from the possibility of disconnection and hence, it is possible to make further difference in line width among the connection lines 111 compared to the related art. Accordingly, it is possible to adjust the resistance value of the scanning line 11 even when the picture frame is not increased.

Further, in this embodiment, by setting the line width w of the auxiliary line 112 in the region DA shown in FIG. 3A to 20 μm or more, a risk of disconnection can be obviated. However, the line width w of the auxiliary line 112 may be further increased with no problem. As shown in FIG. 3A, the line width w of the auxiliary line 112 may be set equal to the line width of the terminal portion 100 or may be set smaller than the width of the terminal portion 100 (the line width of the terminal portion 100 being approximately 75 μm on a long side of the TFT substrate 10 and approximately 30 μm on a short side of the TFT substrate 10).

In FIG. 3A and FIG. 3B, the glass debris PG is larger than the gap g1 between the TFT substrate 10 and the color filter substrate 20 and hence, the glass debris PG does not enter the gap g1. Flaws caused by glass debris which is small enough to enter the gap g1 do not cause disconnection. However, the connection line 111 includes a fine line portion and hence, when such a portion is outside the sealing portion 15, the connection line 111 may be influenced by the small glass debris PG. In such a case, the connection line 111 may be arranged below the sealing portion 15 or inside the sealing portion 15.

Some terminal portions 100 for scanning lines 11 formed on the short side of the TFT substrate 10 have been explained in conjunction with FIG. 2A and FIG. 2B. The same constitution is applicable to the terminal portions 100 for the data signal lines 12 formed on the long side of the TFT substrate 10 shown in FIG. 2A and FIG. 2B. The terminal portions 100 for the data signal lines 12 may adopt the constitution of the terminal portions 100 for the scanning lines 11 shown in FIG. 4. That is, in forming the terminals for the scanning lines 11 in the layer forming process, the terminals having the same constitution as the constitution of the terminals for the scanning lines 11 can be formed on the long side of the TFT substrate 10 as the terminals for the data signal lines 12. Further, in the course of the manufacturing process, the data signal lines 12 and the terminal portions 100 formed on the long side may be connected with each other.

Figure 5:
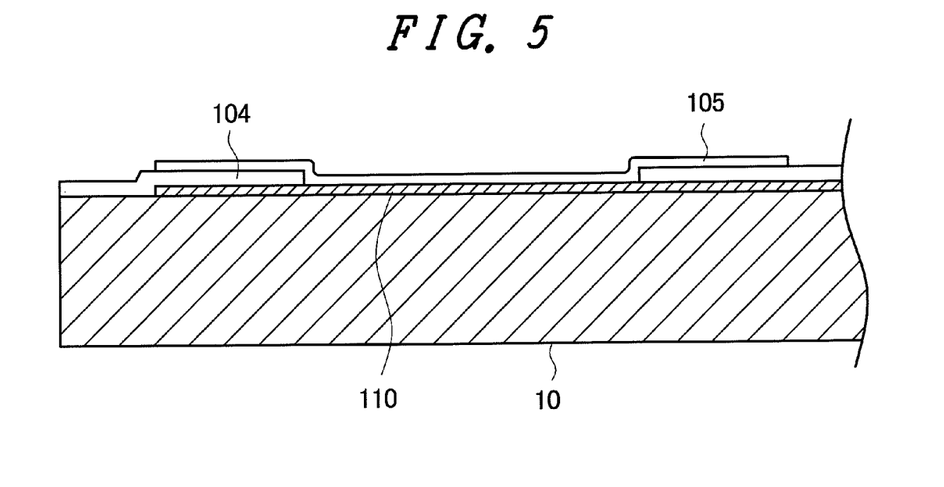
FIG. 5 is a view showing another cross-sectional structure of the terminal portion.

On the other hand, the terminal portions 100 for the data signal lines 12 may be formed with the constitution different from the constitution of the terminal portions 100 for the scanning lines 11. An example of this case is shown in FIG. 5. In FIG. 5, stacked metal layer having the same layer constitution as the data signal line 12 extends on the background metal film 110. The background metal film 110 is also configured such that an Al film is formed as a main body and the Al film is covered with a thin metal film made of Cr, Mo or the like. Such layer structure is adopted for preventing hillock of Al or the occurrence of conductive failure caused by oxidation of Al attributed to contact of the Al film with the ITO film 105.

In FIG. 5, although the background metal film 110 is covered with the passivation film 104, in the terminal portion 100, a through hole is formed for acquiring electric conduction. Further, the ITO film 105 which is formed of a transparent conductive film is formed in a state that the ITO film 105 covers the through hole. There arises no problem in the application of the present invention to the constitution of such a terminal portion 100.

Even when the cross-sectional structure of the terminal portion 100 differs between the terminal portion 100 for the scanning line 11 and the terminal portion 100 for the data signal line 12 as described above, the planar constitution in the vicinity of the terminal portion 100 for the data signal line 12 formed on the long side of the TFT substrate 10 shown in FIG. 2A and FIG. 2B may have the same constitution as the vicinity of the terminal portion 100 formed on the short side of the TFT substrate 10 shown in FIG. 2A and FIG. 2B. Accordingly, the disconnection in the vicinity of the terminal portion 100 on the long side of the TFT substrate 10 can be prevented in the same manner as the disconnection in the vicinity of the terminal portion 100 on the short side of the TFT substrate 10.

Embodiment 2

Figures 6A, 6B:
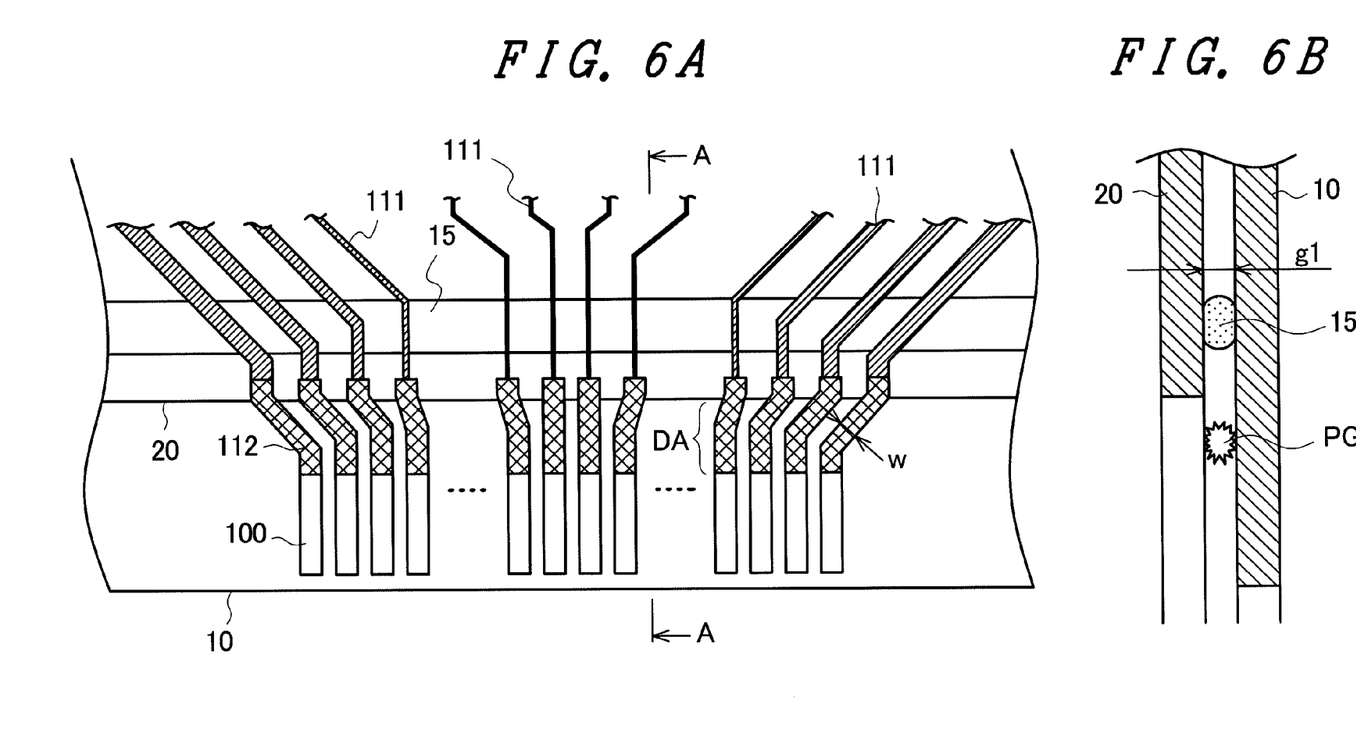
FIG. 6A is a view showing the wiring structure in the vicinity of terminal portions of an embodiment 2.
FIG. 6B is a cross-sectional view taken along a line A-A in FIG. 6A.

FIG. 6A and FIG. 6B show the embodiment 2 of the present invention. FIG. 6A is a view showing the detail of terminal portions 100 of scanning lines 11 formed on the short side of the TFT substrate 10 shown in FIG. 2A and FIG. 2B, and shows a unit of terminals corresponding to one sheet of flexible printed circuit board 30 and the configuration of lines in the vicinity of the unit. FIG. 6B is a cross-sectional view taken along a line A-A in FIG. 6A. In FIG. 6B, glass debris PG which may cause disconnection does not enter a gap between the TFT substrate 10 and the color filter substrate 20. The TFT substrate 10, the color filter substrate 20, a sealing portion 15 and the like shown in FIG. 6A and FIG. 6B have the same constitution as the corresponding parts of the embodiment 1 shown in FIG. 3A and FIG. 3B. Further, the cross-sectional structure of the terminal portion 100 shown in FIG. 6A and FIG. 6B is also substantially equal to the cross-sectional structure of the terminal portion 100 of the embodiment 1 shown in FIG. 4.

The technical feature of this embodiment lies in that the connection from the terminal portion 100 to the connection line 111 for the scanning line 11 is established using the auxiliary line 112 having a fixed line width w. In this embodiment, the auxiliary line 112 forms an oblique line as the auxiliary line 112 extends toward a periphery of the flexible printed circuit board 30. By spreading the auxiliary line 112 toward the outside as shown in FIG. 6, the degree of freedom in routing the oblique line for setting the resistance of the scanning line 11 to a fixed value can be increased.

It is necessary to set a width of the auxiliary line 112 to 20 μm or more in the same manner as the embodiment 1. Further, the width of the auxiliary line 112 is preferably set to 23 μm or more. In FIG. 6A, the width of the auxiliary line 112 is set equal to a width of the terminal portion 100. However, provided that the width of the auxiliary line 112 is 20 μm or more, it is not always necessary to set the width of the auxiliary line 112 equal to the width of the terminal portion 100. That is, the line width of the auxiliary line 112 may be increased provided that there is no possibility of short-circuiting between the auxiliary lines 112 or the line width of the auxiliary line 112 may be decreased to make a range of the region DA further smaller. Further each auxiliary line 112 is set to have the fixed value, it is not always necessary to make the auxiliary line 112 to have the fixed value provided that the line width of the auxiliary line 112 is 20 μm or more.

That is, a portion of the auxiliary line 112 to which the connection line 111 is connected is already spread and hence, a line width of the oblique line in the periphery of the flexible printed circuit board can be increased. This implies that the increase of the width of the oblique line in the periphery of the flexible printed circuit board can reduce a size of a picture frame. On the other hand, since the oblique line in the periphery of the flexible printed circuit board can be increased in size, the line width of the connection line 111 at a center portion of the flexible printed circuit board can be increased. In such a case, even when small glass debris enters a gap g1 between the TFT substrate 10 and the color filter substrate 20, the connection line 111 has no fine portion and hence, there is no possibility of occurrence of disconnection. Although the auxiliary line 112 terminates outside the sealing portion 15 in FIG. 6A, it is needless to say that the auxiliary line 112 may extend to a position below the sealing portion 15 or a position inside the sealing portion 15.

The above-mentioned explanation of the embodiment 2 has been made by taking the terminal portions 100 for the scanning lines 11 formed on the short side of the TFT substrate 10 shown in FIG. 2A and FIG. 2B as an example. However, the embodiment 2 is also similarly applicable to the terminal portions 100 for the data signal lines 12 formed on the long side of the TFT substrate 10 shown in FIG. 2A and FIG. 2B. This embodiment is applicable to the terminal portions 100 for the data signal lines 12 irrespective of whether or not the terminal portion 100 for the data signal lines 12 have the same structure as the terminal portions 100 for the scanning lines 11.

As has been described heretofore, according to the embodiments of the present invention, it is possible to realize the highly reliable liquid crystal display device which can prevent the disconnection in the vicinity of the terminal portion 100 attributed to a foreign material such as glass debris.

What is claimed is:

1. A liquid crystal display device including a liquid crystal display panel which sandwiches liquid crystal in the inside thereof sealed by a TFT substrate, a color filter substrate and a sealing portion, and a flexible printed circuit board which is mounted on the TFT substrate, wherein the TFT substrate has an area larger than the color filter substrate, a plurality of scanning lines extend in a lateral direction and are arranged parallel to each other in a longitudinal direction, a plurality of data signal lines extend in the longitudinal direction and are arranged parallel to each other in the lateral direction, and terminal portions corresponding to the scanning lines are formed on the TFT substrate, the terminal portion is arranged at a region that is not covered by the color filter substrate, the terminal portions are formed as a unit for every flexible printed circuit board, and the terminal portions and the scanning lines are connected by auxiliary lines and connection lines in order from the terminal portions, the connection lines are arranged in a region covered with the color filter substrate, a width of the connection line at a peripheral portion of the unit is set larger than the width of the connection line at a center portion of the unit, the auxiliary line between the terminal portion and the connection line is formed of a straight line, and a width of the auxiliary line is 20 μm or more and is set larger than the width of the connection line at the center portion of the unit, and the auxiliary lines extend to both the region that is covered by the color filter substrate and the region that is not covered by the color filter substrate.

2. A display device according to claim 1, wherein the width of the auxiliary line is 23 μm or more.

3. A display device according to claim 1, wherein the width of the auxiliary line is equal to a width of the terminal portion.

4. A liquid crystal display device including a liquid crystal display panel which sandwiches liquid crystal in the inside thereof sealed by a TFT substrate, a color filter substrate and a sealing portion, and a flexible printed circuit board which is mounted on the TFT substrate, wherein the TFT substrate has an area larger than the color filter substrate, a plurality of scanning lines extend in a lateral direction and are arranged parallel to each other in the longitudinal direction, a plurality of data signal lines extend in the longitudinal direction and are arranged parallel to each other in the lateral direction, and terminal portions corresponding to the data signal lines are formed on the TFT substrate, the terminal portion is arranged at a region that is not covered by the color filter substrate, the terminal portions are formed as a unit for every flexible printed circuit board, and the terminal portions and the data signal lines are connected by auxiliary lines and connection lines in order from the terminal portions, the connection lines are arranged in a region covered with the color filter substrate, a width of the connection line at a peripheral portion of the unit is set larger than the width of the connection line at a center portion of the unit, the auxiliary line between the terminal portion and the connection line is formed of a straight line, and a width of the auxiliary line is 20 μm or more and is set larger than the width of the connection line at the center portion of the unit, and the auxiliary lines extend to both the region that is covered by the color filter substrate and the region that is not covered by the color filter substrate.

5. A display device according to claim 4, wherein the width of the auxiliary line is 23 μm or more.

6. A display device according to claim 4, wherein the width of the auxiliary line is equal to a width of the terminal portion.

7. A liquid crystal display device including a liquid crystal display panel which sandwiches liquid crystal in the inside thereof sealed by a TFT substrate, a color filter substrate and a sealing portion, and a flexible printed circuit board which is mounted on the TFT substrate, wherein the TFT substrate has an area larger than the color filter substrate, a plurality of scanning lines extend in a lateral direction and are arranged parallel to each other in a longitudinal direction, a plurality of data signal lines extend in the longitudinal direction and are arranged parallel to each other in the lateral direction, and terminal portions corresponding to the scanning lines are formed on the TFT substrate, the terminal portions are formed as a unit for every flexible printed circuit board, the terminal portions and the scanning lines are connected by auxiliary lines and connection lines in order from the terminal portions, and the connection line is configured such that the connection line is formed of a straight line at a center portion of the unit and is arranged outside at a peripheral portion of the unit, the connection lines are arranged in a region covered with the color filter substrate, a width of the connection line at a peripheral portion of the unit is set larger than the width of the connection line at a center portion of the unit, the auxiliary line is configured such that the auxiliary line is formed of a straight line at the center portion of the unit and is arranged outside in the peripheral portion of the unit, and a width of the auxiliary line is 20 μm or more, and the auxiliary lines extend to both the region that is covered by the color filter substrate and a region that is not covered by the color filter substrate.

8. A display device according to claim 7, wherein the width of the auxiliary line is 23 μm or more.

9. A display device according to claim 7, wherein the width of the auxiliary line is equal to a width of the terminal portion.

10. A liquid crystal display device including a liquid crystal display panel which sandwiches liquid crystal in the inside thereof sealed by a TFT substrate, a color filter substrate and a sealing portion, and a flexible printed circuit board which is mounted on the TFT substrate, wherein the TFT substrate has an area larger than the color filter substrate;

a plurality of scanning lines extend in a lateral direction and are arranged parallel to each other in a longitudinal direction, a plurality data signal lines which extend in the longitudinal direction and are arranged parallel to each other in the lateral direction, and terminal portions corresponding to the data signal lines are formed on the TFT substrate, the terminal portions are formed as a unit for every flexible printed circuit board, the terminal portions and the data signal lines are connected by auxiliary lines and connection lines in order from the terminal portions, and the connection line is configured such that the connection line is formed of a straight line at a center portion of the unit and is arranged outside at a peripheral portion of the unit, the connection lines are arranged in a region covered with the color filter substrate, a width of the connection line at a peripheral portion of the unit is set larger than the width of the connection line at a center portion of the unit, the auxiliary line is configured such that the auxiliary line is formed of a straight line at the center portion of the unit and is arranged outside in the peripheral portion of the unit, and a width of the auxiliary line is 20 μm or more, and the auxiliary lines extend to both the region that is covered by the color filter substrate and a region that is not covered by the color filter substrate.

11. A display device according to claim 10, wherein the width of the auxiliary line is 23 μm or more.

12. A display device according to claim 10, wherein the width of the auxiliary line is equal to a width of the terminal portion.

* * * * *